United States Patent [19]

Simpson et al.

[11] Patent Number: 5,965,873
[45] Date of Patent: Oct. 12, 1999

[54] INTEGRATED CMOS SPECTROMETERS

[75] Inventors: Michael L. Simpson; M. Nance Ericson; William B. Dress, all of Knoxville; Gerald E. Jellison, Oak Ridge, all of Tenn.; David N. Sitter, Jr., Tucson, Ariz.; Alan L. Wintenberg, Knoxville, Tenn.

[73] Assignee: Lockheed Martin Energy Research Corporation, Oak Ridge, Tenn.

[21] Appl. No.: 09/082,082

[22] Filed: May 20, 1998

Related U.S. Application Data

[63] Continuation of application No. 08/932,225, Sep. 17, 1997, abandoned.

[51] Int. Cl.⁶ ........................................ H01J 40/14
[52] U.S. Cl. .................... 250/214.1; 250/226; 257/461
[58] Field of Search ................ 250/214.1, 214 R, 250/226; 356/346, 349; 257/461, 464, 458

[56] References Cited

U.S. PATENT DOCUMENTS

| | | | |
|---|---|---|---|
| 4,079,405 | 3/1978 | Ohuchi et al. | 257/464 |
| 4,191,452 | 3/1980 | Grinberg et al. | 257/222 |
| 4,820,915 | 4/1989 | Hamakawa et al. | 250/226 |
| 5,726,440 | 3/1998 | Kalkhoran et al. | 250/214.1 |

*Primary Examiner*—Que T. Le
*Attorney, Agent, or Firm*—Quarles & Brady LLP

[57] ABSTRACT

A spectrometer, comprises: a semiconductor having a silicon substrate, the substrate having integrally formed thereon a plurality of layers forming photo diodes, each of the photo diodes having an independent spectral response to an input spectra within a spectral range of the semiconductor and each of the photo diodes formed only from at least one of the plurality of layers of the semiconductor above the substrate; and, a signal processing circuit for modifying signals from the photo diodes with respective weights, the weighted signals being representative of a specific spectral response. The photo diodes have different junction depths and different polycrystalline silicon and oxide coverings. The signal processing circuit applies the respective weights and sums the weighted signals. In a corresponding method, a spectrometer is manufactured by manipulating only the standard masks, materials and fabrication steps of standard semiconductor processing, and integrating the spectrometer with a signal processing circuit.

14 Claims, 14 Drawing Sheets

S-POLARIZATION

P-POLARIZATION

INTEGRATED CMOS SPECTROMETERS

CROSS REFERENCE TO RELATED APPLICATIONS

This application is a continuation of U.S. patent application Ser. No. 08/932,225 (abandoned).

BACKGROUND OF THE INVENTION

1. Field of the Invention

This invention relates to the field of photo-spectrometers, and in particular, to photo-spectrometers realized in a standard semiconductor process, to an IC compatible photo diode spectral selectivity/enhancement method using multiple pn junctions and to a method for determining light spectra using optical detectors with controllable spectral response.

2. Description of Related Art

Photo-spectrometers are used in a variety of scientific and industrial applications including atmospheric measurements, medical instruments, flame monitoring in commercial hydrocarbon-fueled furnaces and aircraft engines, and a number of colorimetry applications ranging from color scanners to industrial process control. Even red-green-blue color imaging is a limited application of photo-spectroscopy.

Many photo-spectrometers consist of an array of photodiodes, an optical filtering or dispersive element, collimating and focusing optics, and data collection electronics. Each technique allocates a wavelength band to one photodiode in the array. Although these systems are capable of resolution better than 1 nm, they require precise alignment, are relatively expensive, and are too large for micro-instrumentation applications.

Micro-fabrication techniques are used to produce photo-spectrometers that overcome the disadvantages of the systems described above. There is on-going research to produce spectrometers based on silicon-on-insulator (SOI) photodiode arrays. Fabry-Perot micro-spectrometers have been produced using bulk and surface micro-machining techniques, and a spectrometer composed of a micro-fabricated diffraction grating attached to a CCD array has been realized. In addition, a calorimeter realized using an amorphous silicon (Si) Schottky photodiode has also been reported.

These micro-fabricated spectrometers or calorimeters are capable of good spectral resolution and are appropriate for micro-instrumentation. However, these devices require fabrication steps or materials that are not part of a low-cost, standard IC process and do not take full advantage of mass production in this mature technology. None of these spectrometers can be realized in a standard semiconductor process using only the standard masks, materials, and fabrication steps. Such prior art devices cannot be integrated with additional analog, digital, and wireless circuits constructed in the same semiconductor process to produce a true instrument-on-a-chip.

SUMMARY OF THE INVENTION

The problems of the prior art spectrometers have been overcome in accordance with the inventive arrangements, which utilize a standard, semiconductor process using only the standard masks, materials, and fabrication steps. Devices in accordance with the inventive arrangements can be integrated with additional analog, digital, and wireless circuits constructed in the same semiconductor process to produce a true instrument-on-a-chip. Suitable semiconductor processes include, for example, n-well CMOS, p-well CMOS, silicon-on-insulator (SOI) CMOS, Si bipolar and most other semiconductor processes as well.

Only the masks, materials and fabrication steps inherent to these IC processes need be used. No post processing is necessary to add mechanical or optical devices for filtering. Such a spectrometer can comprise, for example, a set of 18 detectors with independent spectral responses. The responses of these devices can be weighted and summed to form outputs proportional to the power in discrete wavelength bands in a region, for example, from ~350 nm to ~1100 nm for Si. With the solution space restricted to a 60 nm band, this instrument can resolve gaussian input spectra ($\sigma$=5 nm) with a peak-to-peak spacing of less than 15 nm. This device can easily be integrated with additional analog, digital, or wireless circuits to realize a true instrument on-a-chip.

A spectrometer in accordance with an inventive arrangement comprises: a semiconductor having a silicon substrate, the silicon substrate having integrally formed thereon a plurality of layers forming photo diodes, each of the photo diodes having an independent spectral response to an input spectra and each of the photo diodes formed only from at least one of the plurality of layers of the semiconductor above the silicon substrate; and, a signal processing circuit for modifying signals from the photo diodes with respective weights, the weighted signals being representative of a specific spectral response. The signal processing circuit sums the weighted signals to define a composite spectral response function, which can be plotted.

The photo diodes are advantageously manufactured in accordance with standard semiconductor processes, including for example, the n-well CMOS process, the p-well CMOS process, the silicon-on-insulator (SOI) CMOS process, the Si bipolar process and most other semiconductor processes as well.

The photo diodes can have different junction depths and different polycrystalline silicon and oxide coverings.

The respective weights are set in accordance with predetermined information regarding an expected limited range of wavelengths to be detected within the broader spectral range of the semiconductor. The limited range of wavelengths to be detected is preferably approximately 100–200 nanometers.

The range of the input light can be anything within the spectral range of the particular semiconductor, for example ~350 nm–1100 nm for Si. However, the spectrometer gives better performance if the spectral range to be detected is known beforehand to be limited within a range of approximately 100–200 nm, within the larger spectral range of the semiconductor.

A spectrometer in accordance with a another inventive arrangement comprises: a semiconductor having a silicon substrate and a light transmissive surface, the semiconductor having a plurality of pn junctions located above the substrate at different fixed depths from the surface, the pn junctions generating respective and independent output signals representative of unique depth-related spectral sensitivity functions; and, a signal processing circuit for modifying signals from the photo diodes with respective weights, the weighted signals being representative of a specific spectral response. The signal processing circuit sums the weighted signals to define a composite spectral response function, which can be plotted.

The pn junctions are advantageously manufactured in accordance with standard semiconductor processes, including for example, the n-well CMOS process, the p-well CMOS process, the silicon-on-insulator (SOI) CMOS process, the Si bipolar process and most other semiconductor processes as well.

The output signals generated by the pn junctions differ from one another by reason of interactions occurring in different regions of the semiconductor above the substrate. The different regions include a p-diffusion region, a depletion region, and a region beyond the depletion region.

A method for manufacturing a spectrometer, in accordance with yet another inventive arrangement, comprises the steps of: providing a plurality of sites on a silicon substrate which have different junction depths and different polycrystalline silicon and oxide coverings, by manipulating only the standard masks, materials and fabrication steps of standard semiconductor processing, each of the sites having an independent spectral response to an input spectra; and, integrating the sites with a circuit for respectively weighting and summing the spectral responses from the sites, by using the standard semiconductor processing, the weighted signals representing a specific spectral response of the input spectra. The weighted signals are preferably summed to define a composite spectral response function, which can be plotted.

The method can further comprise the step of integrating the sites with an analog signal processing circuit, a digital signal processing circuit or a wireless signal processing circuit.

The method advantageously utilizes numerous semiconductor processing, including for example, n-well CMOS processing, p-well CMOS processing, silicon-on-insulator (SOI) CMOS processing, Si bipolar processing and most other semiconductor processing as well.

DETAILED DESCRIPTION OF THE PREFERRED EMBODIMENTS

Figure 1A:
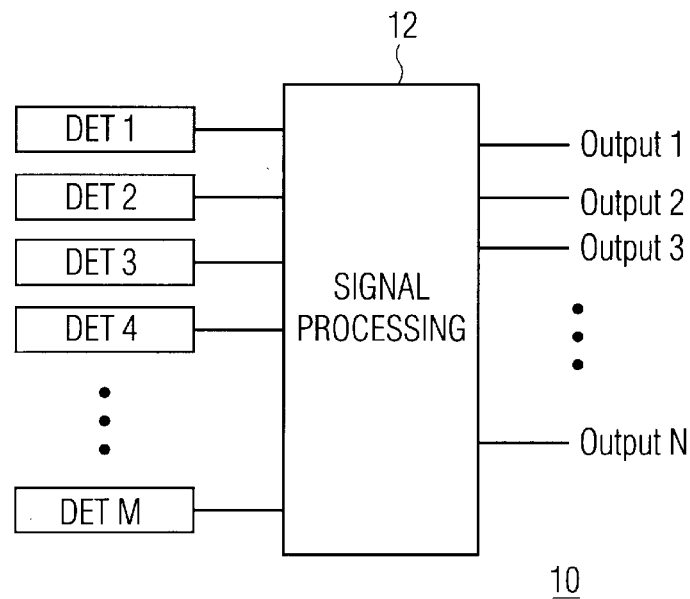
FIGS. 1a and 1b are block diagrams of a photo-spectrometer in accordance with the inventive arrangements, realized in a standard CMOS IC process.

FIG. 1(a) shows a block diagram of a spectrometer 10 in accordance with the inventive arrangements. The spectrometer 10 uses m photodiode detectors designated DET1 through DETm, each with an independent spectral response. A signal processing circuit 12 weights and sums the respective responses of each detector to form n outputs designated OUTPUT1 through OUTPUTn. Each of the n outputs corresponds to the input signal power in a discrete wavelength band.

Figure 1B:
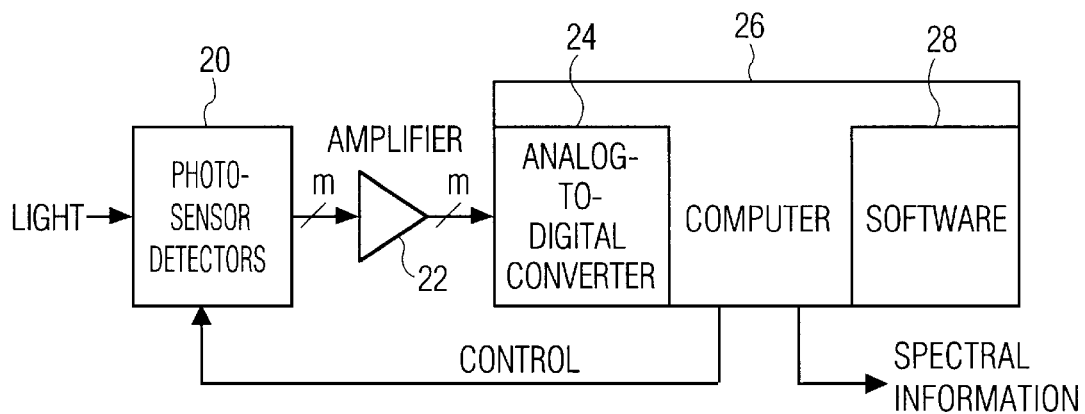

The weights can be changed electronically in-situ to allow a range of programmable spectral functions. The processing of the signals can range from straight-forward sign-weighted summing to digital signal processing or neural net processing. A block diagram of the spectrometer 10 in conjunction with a computer processor is shown in FIG. 1(b). Incident light to be analyzed falls onto an array 20 of m photo detectors. The outputs of the m photo detectors are amplified by an array of amplifiers 22, the outputs of which are digitized by digital to analog converter 24, which may form part of a digital processor in a computer 26. A software program 28 can process the digitized data and provide spectral information as an output, in digital or analog form, in numerous formats. The computer also provides control signals for the array 20 of photo detectors.

Data processing options are numerous and range from straight-forward analog processing including but not limited to weighted summing and subtraction, to more complex methods including artificial neural net processing and digital signal processing methods, or any combination thereof.

Generally speaking, two or more pn junctions located at different fixed depths from the surface of the semiconductor can provide different output signals, each with a unique depth-related spectral sensitivity function. Monochromatic light is normally incident on the surface of the pdiff region of the detector. Depending on the wavelength of the light, interactions can occur in three regions: the p-diffusion region, the depletion region, and the region beyond. The various layers above the silicon substrate can be manipulated to control these interactions and provide the independent spectral sensitivities.

In accordance with the inventive arrangements, photodiode detectors with respective and independent spectral responses are created and the appropriate weights for each independent spectral response are determined. The independent spectral responses and the appropriate weights can be determined in accordance with the following analysis and methodology.

Suppose there are m basis functions that can represent any possible detector-array spectrum. That is, let $s(\lambda)$ be the power spectral density of any source illuminating the detector array, then $$s(\lambda) = \sum_{j=1}^{m} a_j B_j(\lambda), \tag{1}$$

where the $\alpha_j$ are the set of numerical coefficients, the $B_j(\lambda)$ are the basis functions that characterize the detector array, and m is the number of individual photo detectors in the array. Physically, the coefficients are the responses of the devices, while the basis functions are yet to be determined.

The responses of the detectors are given by $$a_j = \int_{\lambda_0}^{\lambda_1} R_j(\lambda) s(\lambda) d\lambda, \tag{2}$$

where $\alpha_j$ and $s(\lambda)$ have the same meaning as above and $R_j(\lambda)$ is the spectral response of the $j^{th}$ detector. A means or methodology is needed to compute the basis functions given a sampled representation of the spectral-response functions. That is, a numerical solution is needed to the result of substituting equation (1) into equation (2), $$a_j = \int_{\lambda_0}^{\lambda_1} R_j(\lambda) \sum_{k=1}^{m} a_k \beta_k(\lambda) d\lambda = \sum_{k=1}^{m} a_k \int_{\lambda_0}^{\lambda_1} R_j(\lambda) \beta_k(\lambda) d\lambda. \tag{3}$$

This set of equations is to be solved for the $\beta(\lambda)$ in terms of $R(\lambda)$ on discrete set of samples $\{\lambda_q\}$ for q=1, . . . , n. If a stable set of approximate solutions to this set of integral equations can be found, a spectrum can be obtained of many possible photon distributions falling within the range of $\lambda_0 \leq \lambda \leq \lambda_1$ by multiplying the vector of measured device responses by the numerical matrix representing the basis set, or $$s_\lambda = \sum_{j=1}^{m} \beta_{\lambda j} a_j, \tag{4}$$

where now $\lambda$ is an integer that indexes the set of wavelengths used in characterizing the response functions (i.e., in calibrating the device array) and $\beta_{\lambda j}$ is the numerical matrix obtained from an approximate solution to (3).

If the detector array is calibrated using a standard monochromator with slits set for a spectral width of 5 nm and measurements are made every 5 nm between $\lambda_0$=400 nm and $\lambda_1$=1100 nm, the integral equations in (3) can be approximated by the matrix equation $$\alpha_j = \Sigma_{\lambda,k} \alpha_k R_{\lambda,j} \beta_{\lambda,j} \Delta \lambda, \tag{5}$$

or $$\vec{\alpha} = \beta R \vec{\alpha}, \tag{6}$$

where the measured coefficient vector is $\vec{\alpha}$, the response matrix, R, is now the spectral response integrated over the slit function represented by $\Delta\lambda$=5 nm, and $\beta$ is the unknown set of discrete basis functions on the interval from 400 to 1100 nm. Equation (6) has the formal solution, $\beta=R^{-1}$, but the actual numerical solution involves a bit of manipulation.

Typically there are far more wavelength samples than photo detectors. The standard way to invert the matrix R, which in the example presented herein is a set of m=20 by n=141 numbers, is to use the Moore-Penrose pseudo inverse, giving $$\beta = (RR^T)^{-1} R, \tag{7}$$

provided that the inverse of the square, m-by-m matrix exists. By the construction of R times its transpose, this form is equivalent to a least-squares solution of the matrix equation (6). If the pseudo inverse is computed using the method of singular-value decomposition, however, control is retained over which calibration sets are important and which may be ignored. Thus, a decomposition of the matrix R into three matrices is sought in the form $$R = U w V^T, \tag{8}$$

where U is an m-by-m column-orthogonal matrix, w is an m-by-m diagonal matrix whose non-zero elements are the m singular values, and V is an n-by-m column-orthogonal matrix. The pseudo inverse is then given by $$\beta = V w^{-1} U^T \tag{9}$$

and the measured spectrum is given by equation (4).

The key to establishing that certain calibration sets are not important is contained in the ratio of the m singular values to the largest singular value. Such ratios approaching machine precision are suspect. The standard way to treat such contributions is to set the reciprocal of those terms to zero in equation (9). In this example, calibration sets that contribute the small singular values are simply removed, and subsequently, readings from the corresponding photodetectors are blocked out. Alternatively, other approaches such as consolidating similar detectors can be implemented.

In accordance with the inventive arrangements, photo detectors are created with independent spectral responses in the wavelength regions of interest using only the processing steps inherent to standard CMOS IC fabrication. It is an important advantage of the inventive arrangements that no post processing of the Si wafer is required. Thus, only the silicon dioxide, aluminum, and polycrystalline silicon layers above the Si substrate, and the placement and geometry of wells and diffusions in the substrate, can be specified. The spectral responses of the detectors can be differentiated by using thin-film interference effects and by taking advantage of the wavelength dependence of the photon absorption depth in crystalline and polycrystalline Si.

The layers of polycrystalline silicon and $SiO_2$ over the photo detectors behave as a stack of thin-film filters. The optical transmission of the assembly can be determined if the polarization and angle of incidence of the light are known and if the thickness and the index of refraction of each layer is known.

Figure 2:
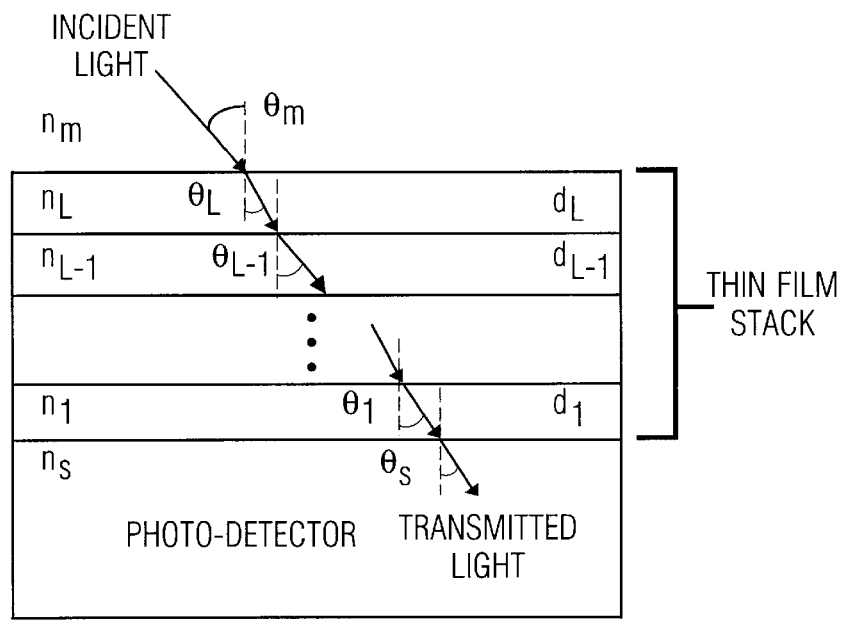
FIG. 2 is a diagram illustrating geometry of a thin-film stack.

FIG. 2 illustrates the geometry of a thin-film stack comprised of L layers. Incident light enters the top layer at an angle of incidence θm. The subsequent angles of incidence change at each layer, until light transmitted through each of the layers enter the photo-detector layer.

Figure 3A:
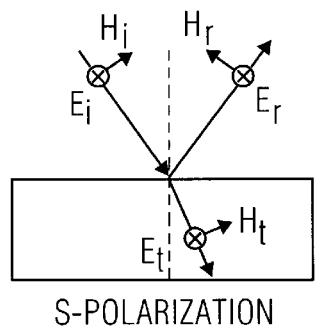
FIGS. 3(a) and 3(b) are diagrams illustrating perpendicular (S) and parallel (P) polarization states, respectively, of incident light.
Figure 3B:
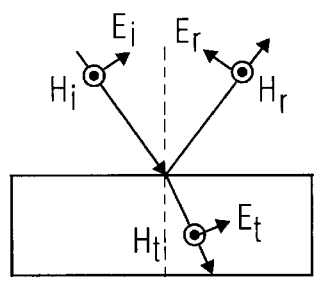

The polarization effects of the thin-film stack may be determined by decomposing the incident light into two orthogonal states: s-polarization, wherein the electric field is perpendicular to the plane of incidence; and, p-polarization, wherein the electric field is parallel to the plane of incidence. FIG. 3 illustrates the two polarization states. The intensity transmittance for a given polarization, (s– or –p) is given by $$T = \frac{\eta_s}{\eta_m}|t|^2, \quad (10)$$

where t is the amplitude transmittance of the thin-film stack for the polarized light, $n_s$ is the effective refractive index of the photo detector semiconductor material, and $n_m$ is the effective refractive index of the incident medium. In general, the effective refractive index for any of the material layers is defined by $$\eta_j = \begin{cases} \dfrac{n_j}{\cos\theta_j} & p-polarization \\ n_j\cos\theta_j & s-polarization \end{cases}, \quad (11)$$

where $n_j$ is the refractive index (which is complex-valued for absorbing materials) of layer j, and $\theta_j$ is the angle of the light ray with respect to the surface normal in the material layer.

The relationship between the angle of the light ray in any two adjacent layers is given by Snell's Law $$n_j \sin\theta_j = n_{j+1}\sin\theta_{j+1} \quad (12)$$

For a given polarization, the amplitude transmittance is given by $$t = \frac{2\eta_m}{\eta_m B + C}, \quad (13)$$

where B and C are calculated by $$\begin{pmatrix} B \\ C \end{pmatrix} = M\begin{pmatrix} 1 \\ \eta_s \end{pmatrix}, \quad (14)$$

and where the matrix M is given by $$M = M_L M_{L-1} \ldots M_2 M_1. \quad (15)$$

Thus, the thin-film effects for each layer are described by a matrix $M_j$ (where j=1, 2, . . . , L). The matrix for each layer is given by $$M_j = \begin{pmatrix} \cos\delta_j & \dfrac{i}{\eta_j}\sin\delta_j \\ i\eta_j\sin\delta_j & \cos\delta_j \end{pmatrix}, \quad (16)$$

where $i = \sqrt{-1}$ and $$\delta_j = \frac{2\pi}{\lambda}(n_j d_j \cos\theta_j), \quad (17)$$

where $d_j$ is the thickness of the thin-film layer and λ is the wavelength of the light in a vacuum.

For unpolarized or randomly polarized light, the intensity transmittance for the thin-film stack is given by $$T_{unpolarized} = \frac{1}{2}(T_s + T_p), \quad (18)$$

where $T_s$ is the intensity transmittance of s-polarized light and $T_p$ is the intensity transmittance of p-polarized light.

The IC process used for this example included two metal, two polycrystalline silicon, and six oxide layers. A designer has full control over placement of the polycrystalline silicon and metal structures, and some control over the placement of $SiO_2$ layers. Table 1 identifies the filter element layers available in standard CMOS processes. FIGS. 4 and 5 show examples of devices that can be fabricated in the CMOS process used in accordance with the inventive arrangements.

TABLE 1

| Layer Name | Description |
| --- | --- |
| COG | top level passivation oxide |
| CVA | metal 1 / metal 2 via oxide |
| CCE | metal 1 to polycrystalline silicon or diffusion oxide |
| CEL | polycrystalline silicon 2 |
| cox | polycrystalline silicon 1 to 2 oxide |
| CPG | polycrystalline silicon 1 |
| CAA | field oxide |
| gox | MOSFET gate oxide |

Figure 4A:
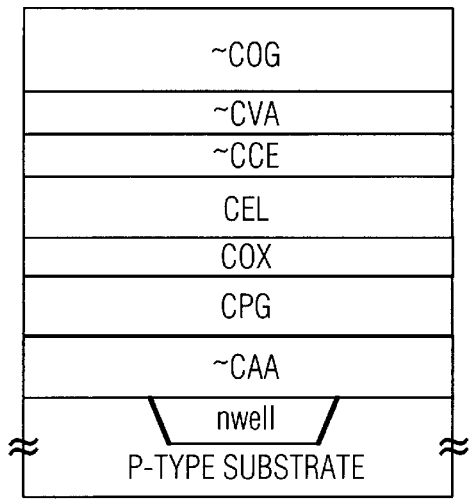
FIGS. 4(a), 4(b) and 4(c) are diagrams illustrating n-well/p-substrate photo detectors with double polycrystalline silicon covering and all oxides present, passivation removed, and minimum oxide, respectively.
Figure 4B:
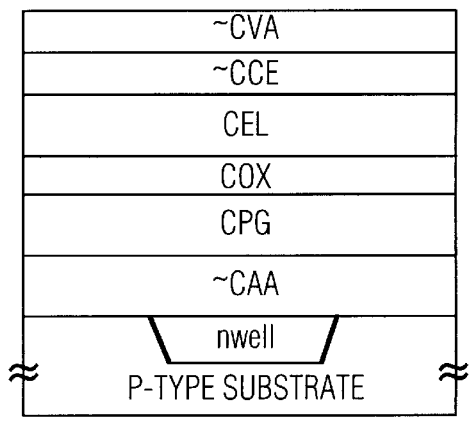
Figure 4C:
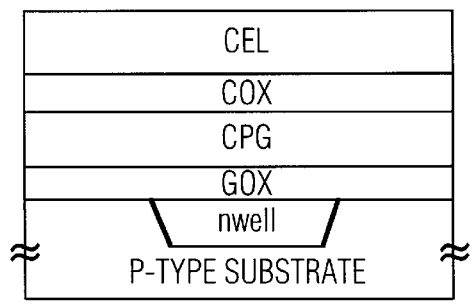

In FIGS. 4(a), 4(b) and 4(c), an n-well/p-substrate diode is shown with a double polycrystalline silicon covering and three $SiO_2$ covering options. FIG. 4(a) shows all oxides present. FIGS. 4(b) shows passivation removed. FIG. 4(c) shows minimum oxide.

Figure 5A:
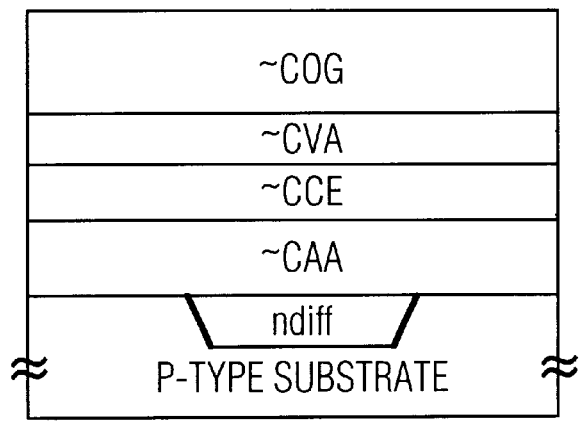
FIGS. 5(a), 5(b) and 5(c) are diagrams illustrating n-diffusion/p-substrate photo detectors with no polycrystalline silicon covering and all oxides present, passivation removed, and minimum oxide, respectively.
Figure 5B:
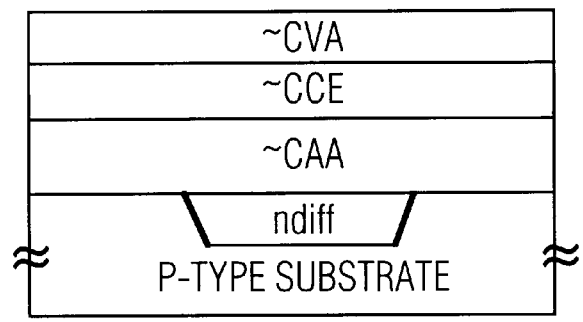
Figure 5C:
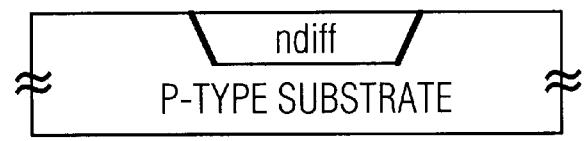

FIGS. 5(a), 5(b) and 5(c) illustrate an n-diffusion/ substrate diode with no polycrystalline silicon coverings, and the same three $SiO_2$ covering options shown in FIGS. 4(a), 4(b) and 4(c). Unfortunately, the prohibited use of polycrystalline silicon structures over n-diffusion and p-diffusion devices in self-aligning CMOS processes limits the detector covering options.

Figure 6:
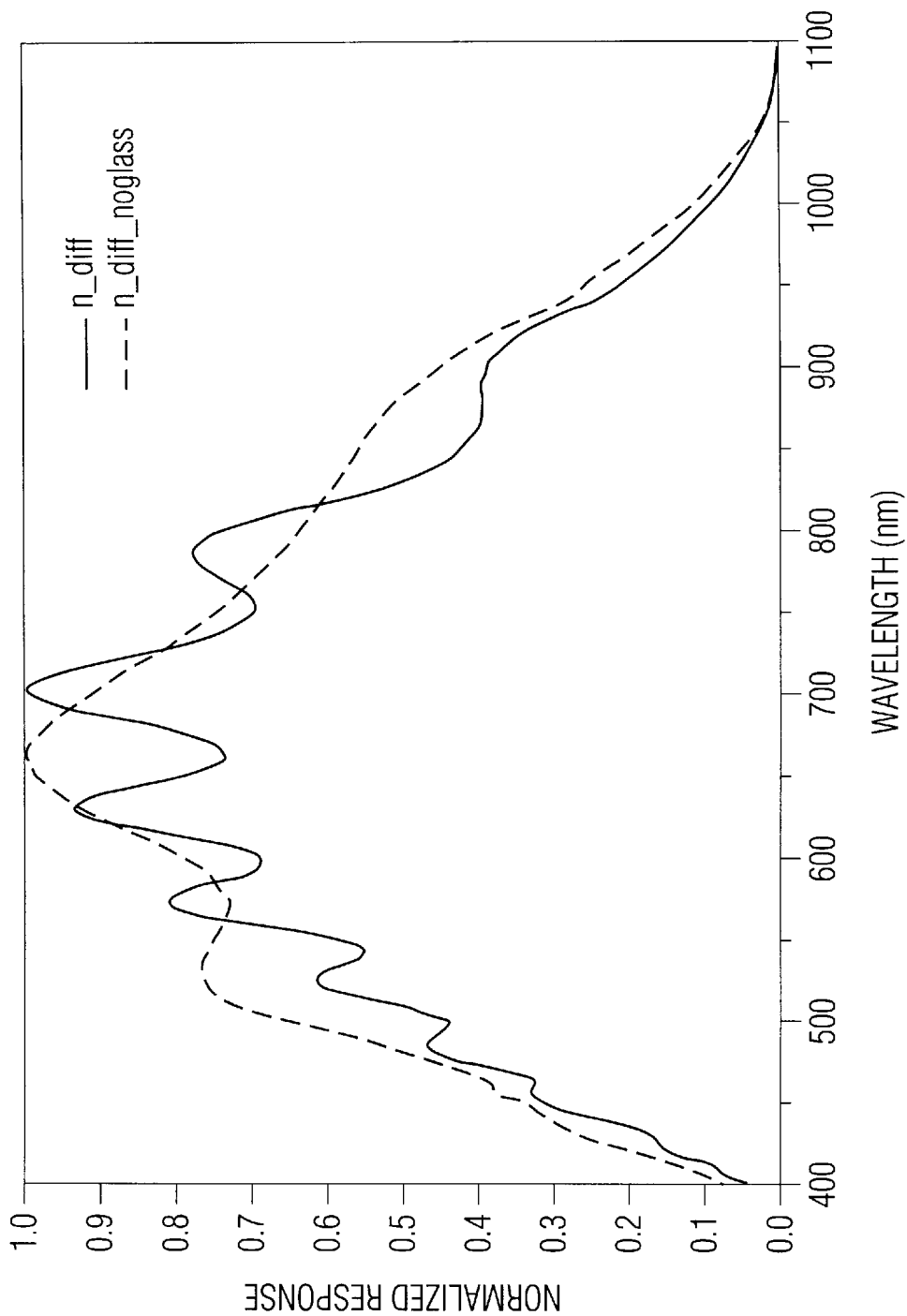
FIG. 6 is a plot useful for explaining n-diffusion device response with two different oxide thicknesses.

FIG. 6 shows the response of two photodiodes with different $Sio_2$ coating thicknesses. Two distinct interference patterns are seen.

Figure 7:
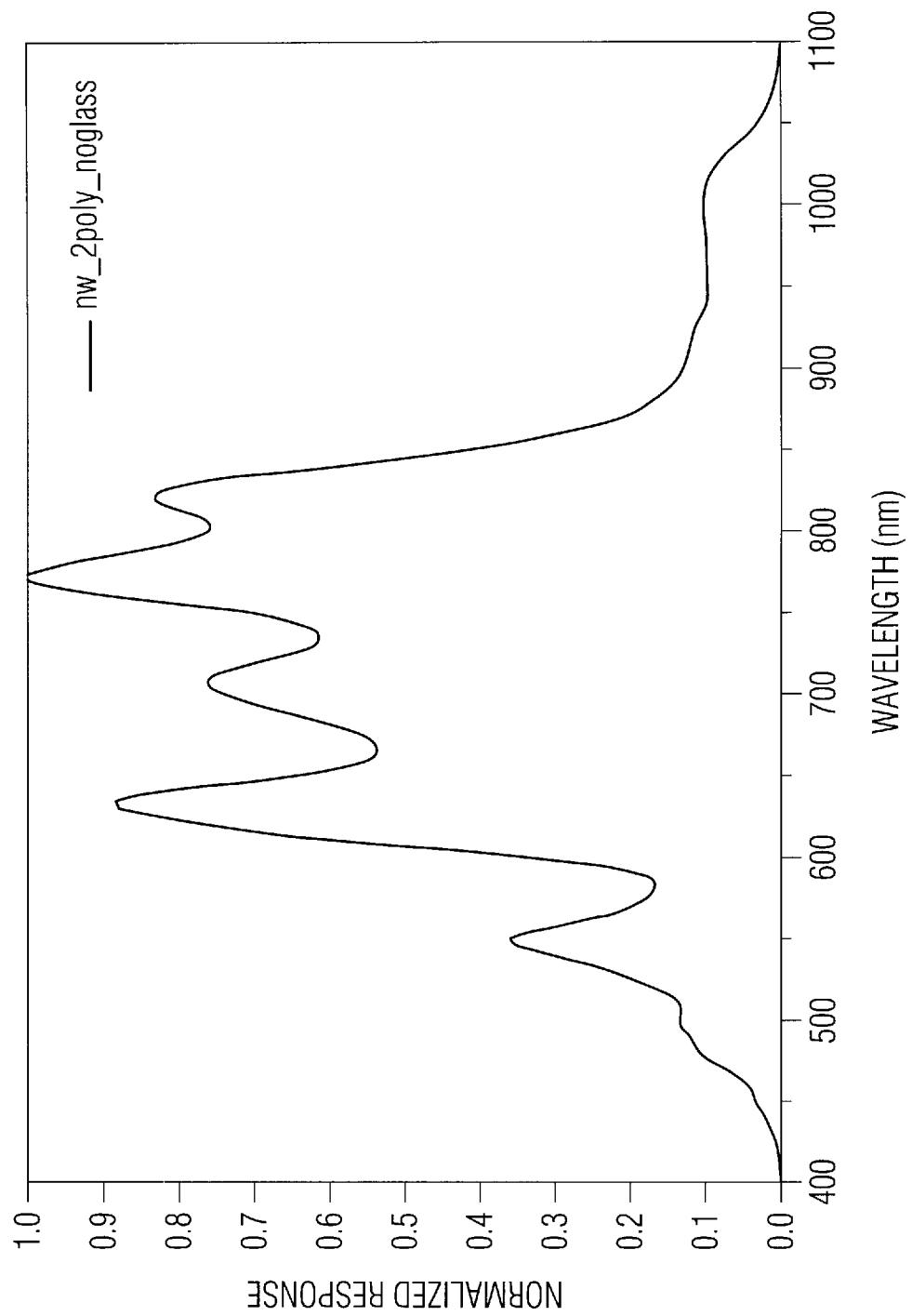
FIG. 7 is a plot useful for explaining n-well/p-substrate device response with a polycrystalline silicon/oxide/polycrystalline silicon covering.

FIG. 7 shows the response of an n-well/p-substrate photodiode with a covering of two polycrystalline silicon layers separated by a thin-film of $SiO_2$. This response function is rich with interference structure.

Figure 8:
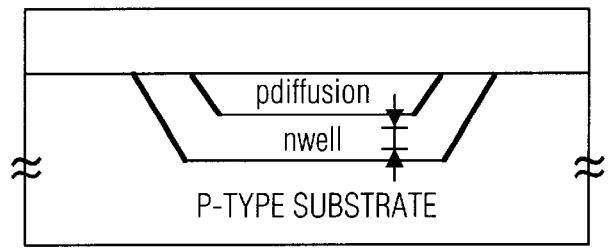
FIG. 8 is a diagram of a multi-junction device (stack-diode).
Figure 9A:
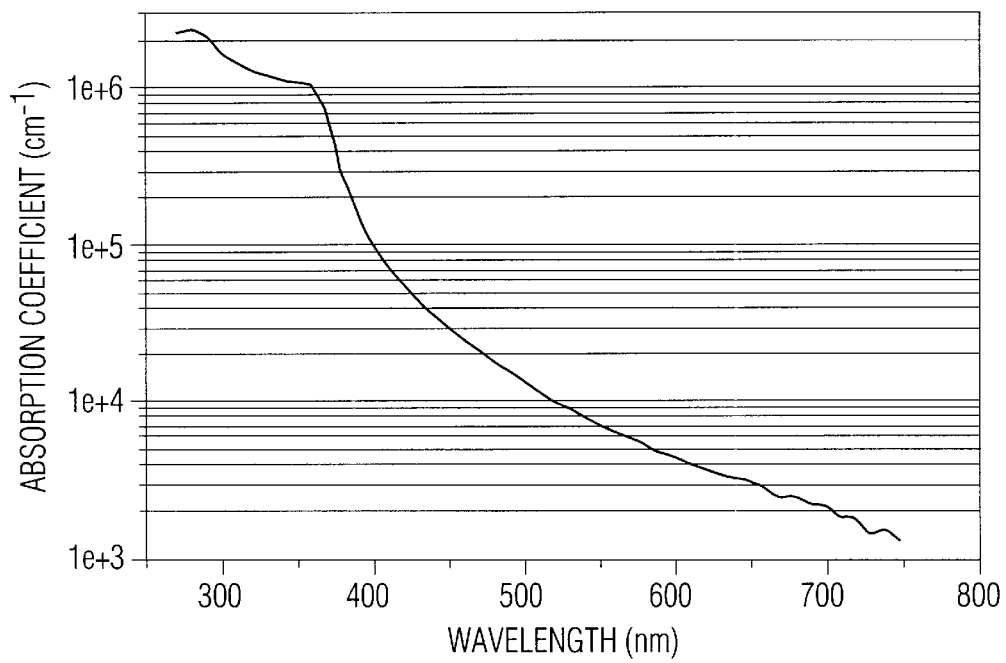
FIG. 9(a) is a plot useful for explaining silicon absorption coefficient (a) vs. wavelength.
Figure 9B:
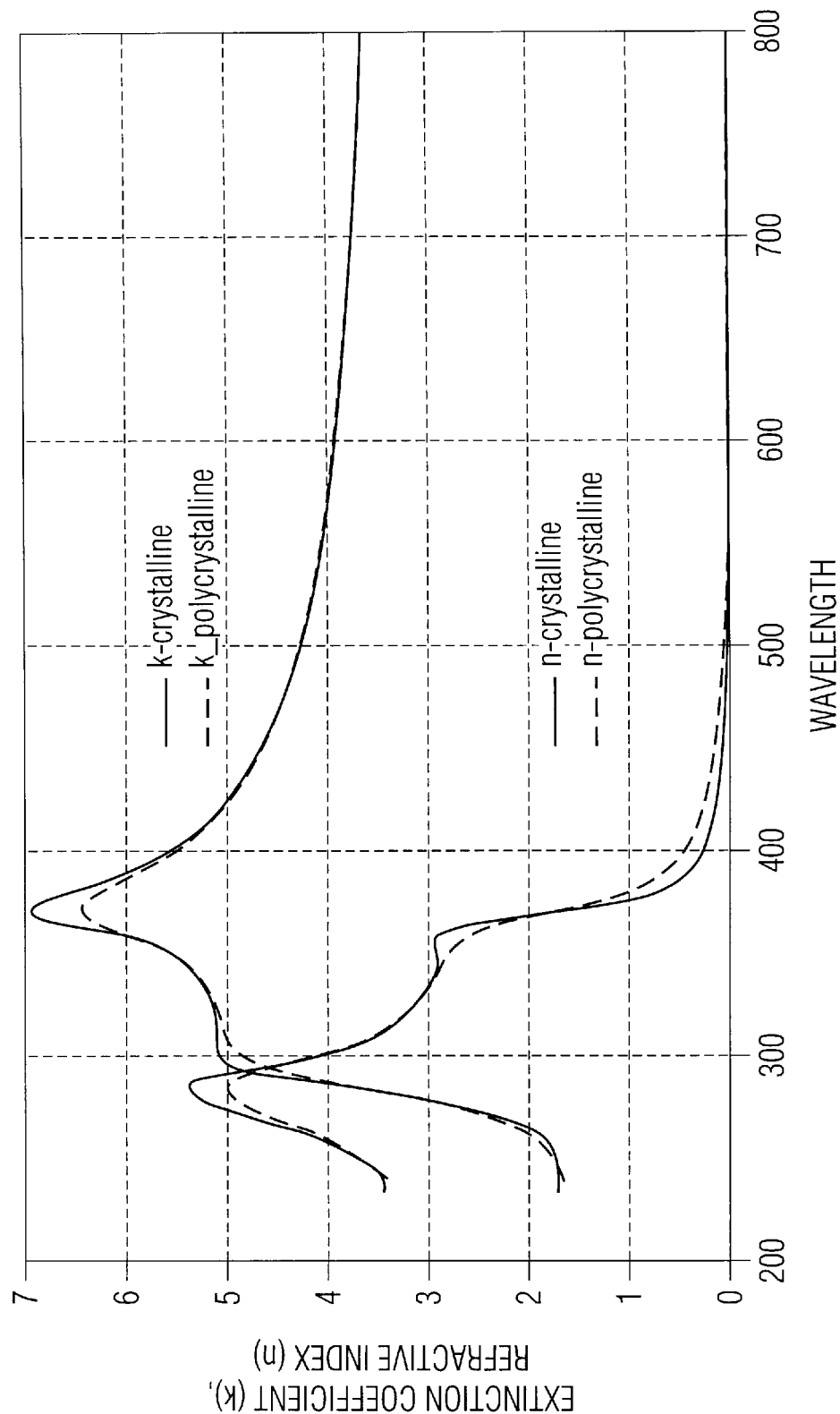
FIG. 9(b) is a plot useful for explaining the extinction coefficient and refractive index for crystalline and polycrystalline Si.
Figure 10:
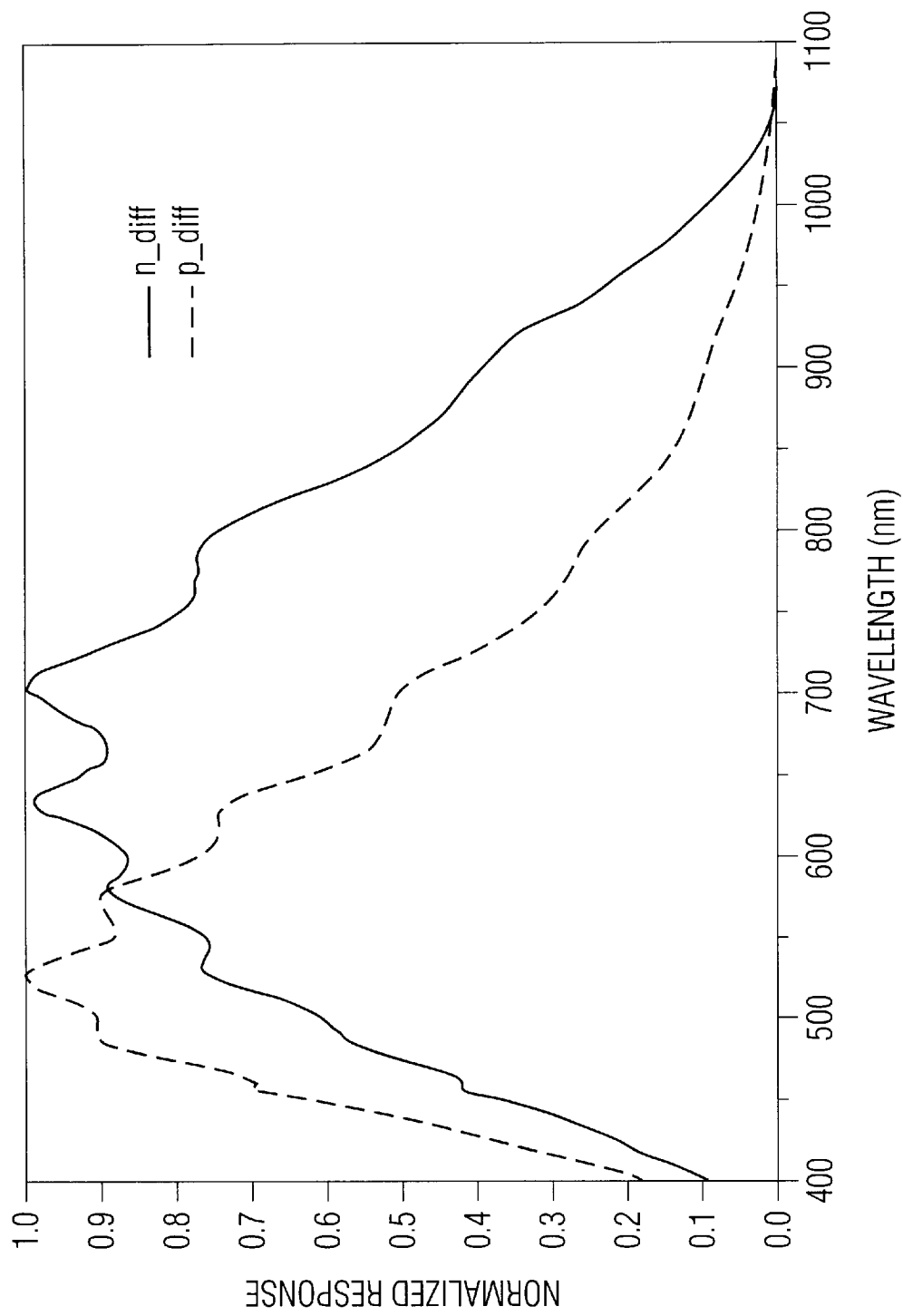
FIG. 10 is a plot useful for explaining the photon response of p-diffusion/n-well and n-well/p-substrate photodiodes.

An n-well CMOS process allows the realization of n-well/ p-substrate, n-diffusion/p-substrate, and p-diffusion/n-well junctions. A double-junction or stack-diode structure is shown in FIG. 8. The depth dependent absorption of light as it passes through this detector is given by $$F_{abs} = F_0 e^{-(ad)}, \quad (19)$$

where $F_0$ is the number of incident photons, $F_{abs}$ is the number of photons absorbed, a is the absorption coefficient for Si, and d is the distance into the detector. As shown in FIG. 9(a), a is a strong function of wavelength, varying from ~$10^6$ cm$^{-1}$ at 300 nm to essentially 0 at 1100 nm. FIG. 9(b)

shows extinction coefficient and refractive index values for crystalline and polycrystalline Si. Thus, longer wavelength light produces charge deep in the device that is preferentially collected at the n-well/p-substrate junction, while shorter wavelength light produces shallow charge that is collected by the p-diffusion/n-well junction. This behavior produces the spectral responses shown in FIG. 10. The p-diffusion/n-well diode has a response that peaks at 500 nm, while the n-well/p-substrate diode response peaks at 750 nm. The stack-diode provides two devices with well differentiated spectral responses.

Using photodiodes with different oxide and polycrystalline silicon coverings as well as the two devices inherent to the stack-diode, 18 devices with independent spectral responses were fabricated. Table 2 gives a brief device description for a photo-spectrometer IC. The devices were commonly made up of 4 smaller devices connected in parallel, that is, a 4-cell structure.

TABLE 2

| Device | Device Name | Description |
| --- | --- | --- |
| 1 | nw_bot_0p | n-well 4-cell structure with 0% poly-Si coverage |
| 2 | nw_bot_20p | n-well 4-cell structure with 20% poly-Si coverage |
| 3 | nw_bot_60p | n-well 4-cell structure with 60% poly-Si coverage |
| 4 | nw_bot_80p | n-well 4-cell structure with 80% poly-Si coverage |
| 5 | nw_bot_100p | n-well 4-cell structure with 100% poly-Si coverage |
| 6 | n-diff_noglass | n-diffusion 4-cell structure - COG removed |
| 7 | n-diff | n-diffusion 4-cell structure |
| 8 | nw_poly | n-well 4-cell structure |
| 9 | nw_poly_noox | n-well 4-cell structure - COG, CVA, CCE, CAA oxides removed |
| 10 | nw_2poly | n-well 4-cell structure with 2 poly-Si coverings |
| 11 | nw_2poly_noglass | n-well 4-cell structure with 2 poly-Si coverings- COG oxide removed |
| 12 | nw_2poly_noox | n-well 4-cell structure with 2 poly-Si coverings- COG, CVA, CCE, CAA oxides removed |
| 13 | n-well_bot_array | n-well 25-cell structure |
| 14 | n-well_bot_big | large n-well single structure |
| 15 | n-well_bot_big_noox | large n-well single structure - COG, CVA, CCE, CAA oxides removed |
| 16 | n-diff_noox_big | large n-diffusion single structure |
| 17 | p_diff | p-diffusion device |
| 18 | n_well | n-well device |

Figure 11:
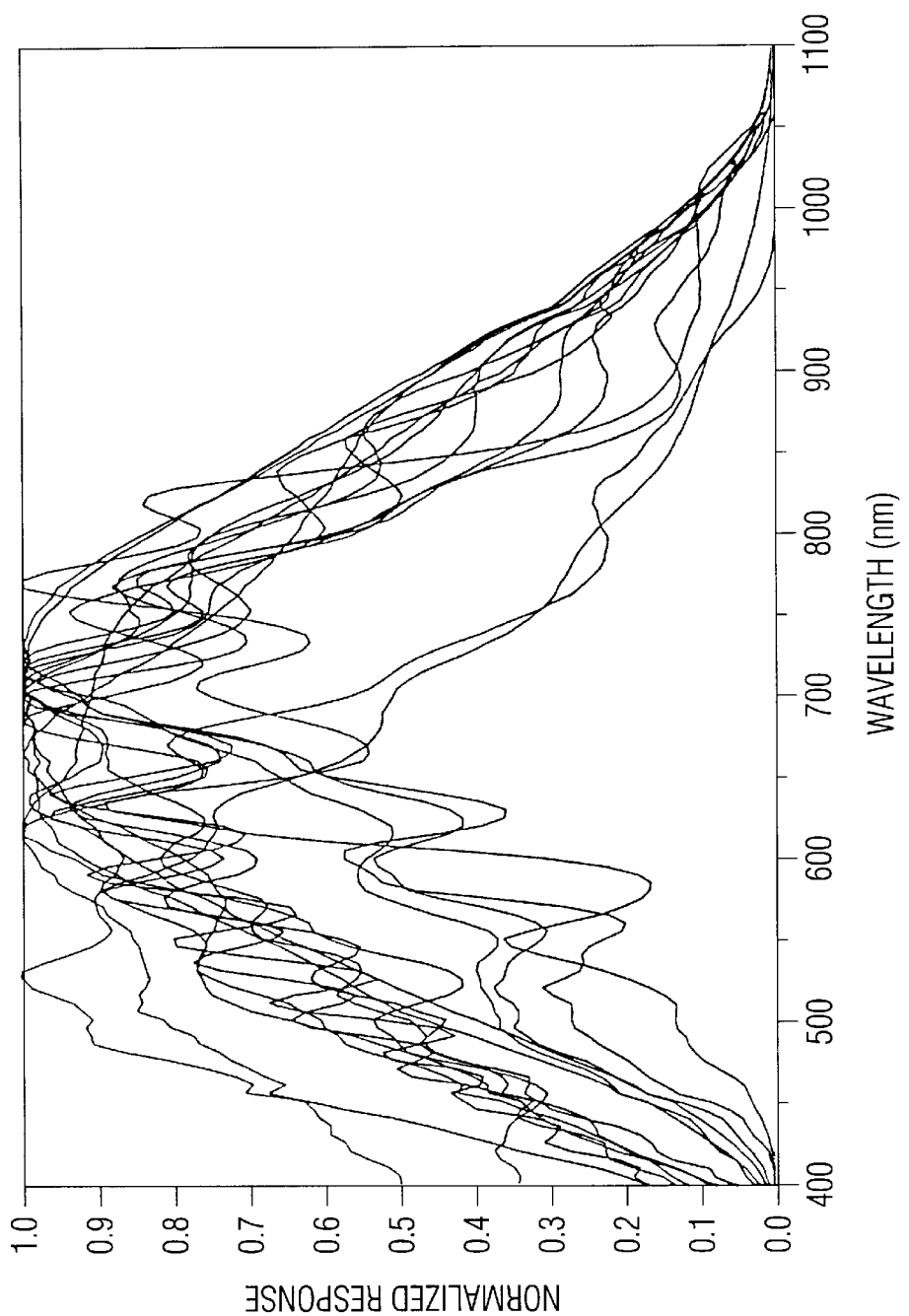
FIG. 11 is plot useful for explaining the photon response of a photo-spectrometer in accordance with the inventive arrangements, utilizing 18 detectors.

FIG. 11 shows the spectral response of all the photodiodes. The photo-spectrometer was calibrated by measuring the response of each detector in 5-nm steps from 400 nm to 1100 nm. Thus, the R matrix was 18×141 (rows× columns). The b matrix was calculated using equation (9), and the input spectra is given by equation (4).

Figure 12A:
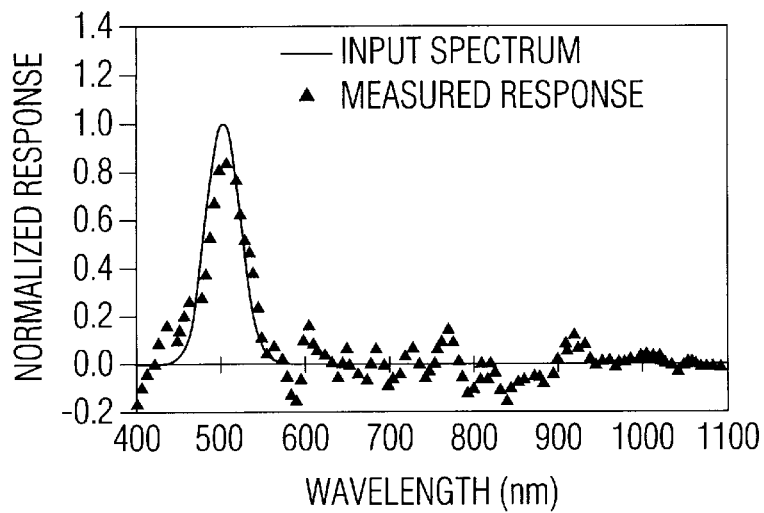
FIGS. 12(a), 12(b) and 12(c) are plots useful for explaining the response of the spectrometer to gaussian input spectra (σ=20 nm) centered at 500 nm, 700 nm, and 1000 nm, respectively, the solution space being constrained to the 400–1100-nm band.
Figure 12B:
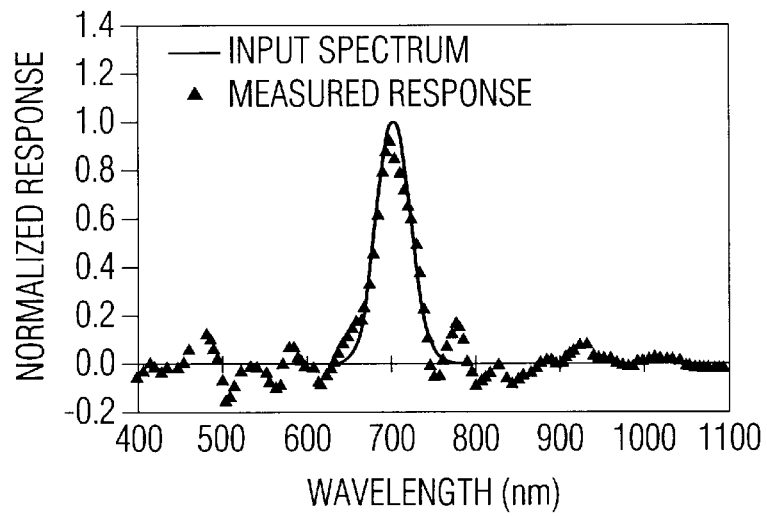
Figure 12C:
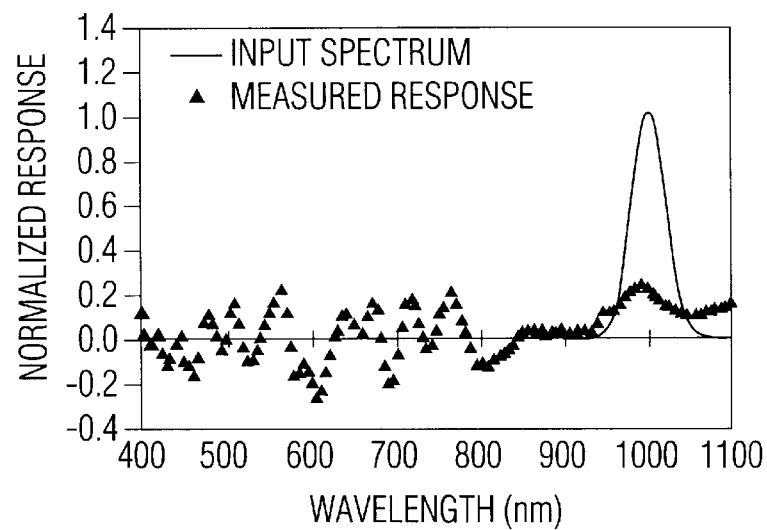
Figure 13:
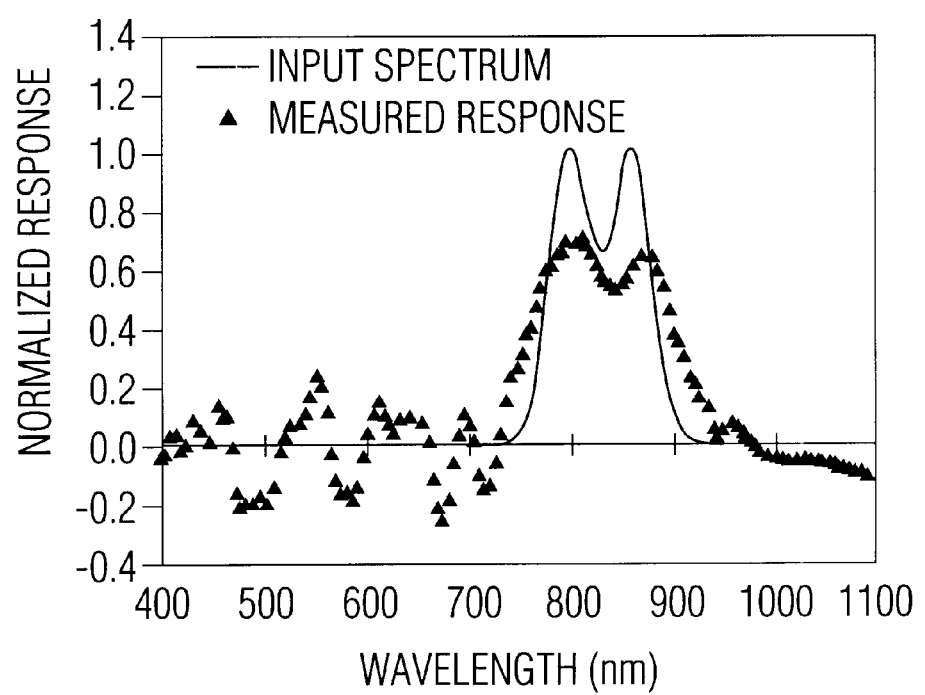
FIG. 13 is a plot useful for explaining the response of the spectrometer to a doublet (one gaussian centered at 800 nm, another at 875 nm, and σ=20 nm for each), the solution space being constrained to the 400–1100-nm band.

The photo-spectrometer was evaluated in two ways. In the first set of tests it was only assumed that the input spectrum resided within the 400–1100-nm band where Si detectors have an appreciable response. The response of the devices to test functions were calculated, and the outputs of the spectrometer were found using equation 3. FIGS. 12(a), 12(b) and 12(c) show the response of the spectrometer, with the above constraint, to gaussian input spectra ($\sigma$=20 nm) centered at 500, 700, and 1000 nm. These plots show that reasonable spectra can be obtained for the 500 and 700 nm inputs (albeit with up to 20% of the measured peak out-of-band noise), while the measurement is quite poor at 1000 nm. FIG. 13 shows the response of the spectrometer to a doublet. One gaussian peak is centered at 800 nm and another is centered at 860 nm, with $\sigma$=20 nm for both. Although this doublet is resolvable, the out-of-band noise exceeds 25% of the peak signal.

Figure 14A:
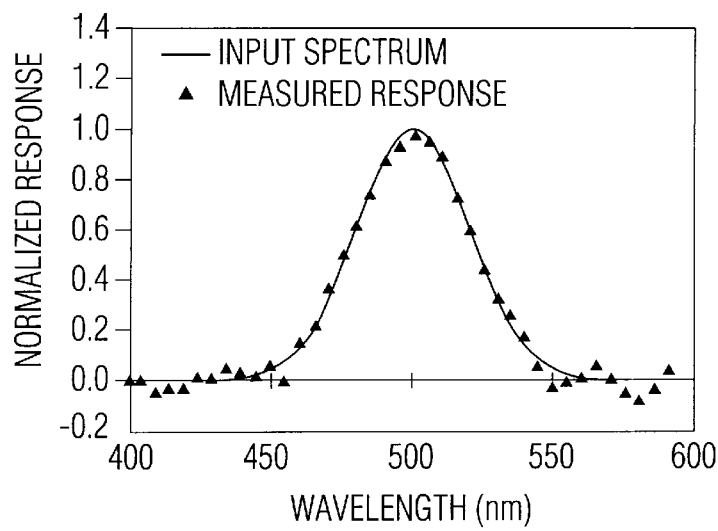
FIGS. 14(a), 14(b) and 14(c) are plots useful for explaining the response of the spectrometer to the same gaussian spectra used to generate FIGS. 12(a), 12(b) and 12(c), the solution space being constrained to the 400–600-nm band, the 500–800-nm band, and the 900–1100-nm band, respectively.
Figure 14B:
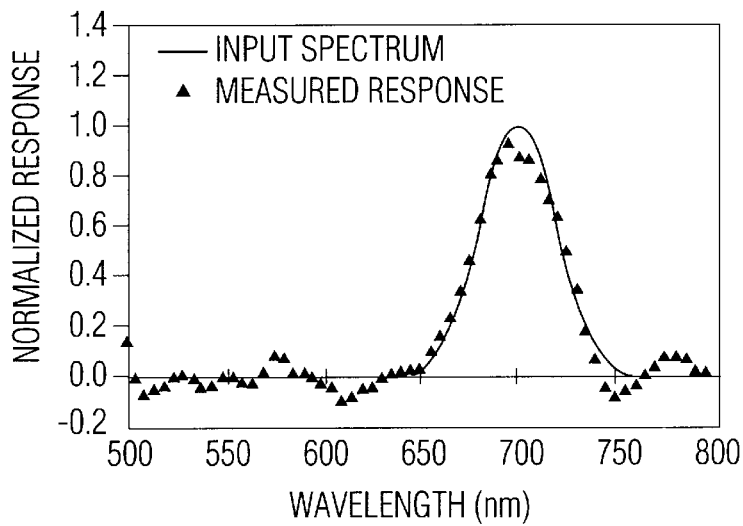
Figure 14C:
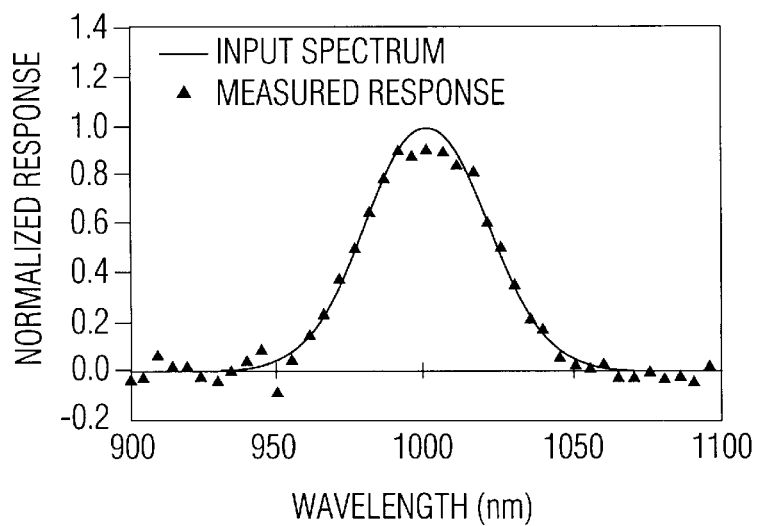
Figure 15:
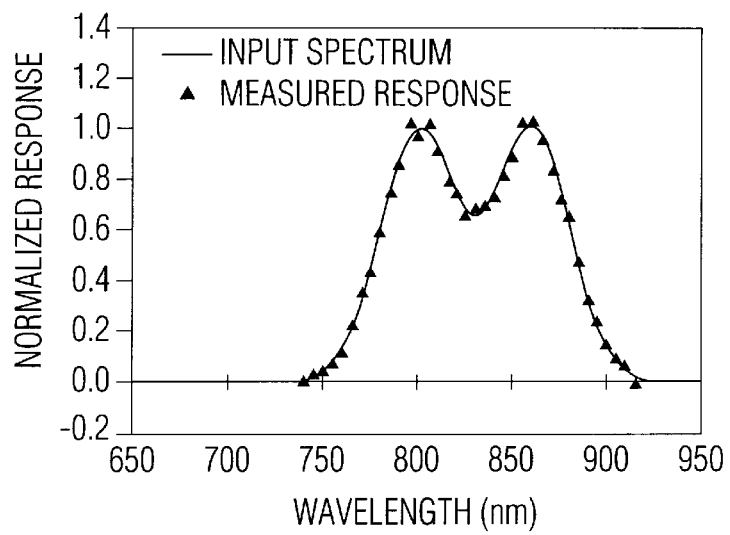
FIG. 15 is a plot useful for explaining the response of the spectrometer to the same doublet used to generate FIG. 13, the solution space being constrained to the 740–910-nm band.

The second set of tests assumed a priori knowledge of the input spectrum was available. In a significant number of measurements the general region of the expected input spectrum is known and only the details of the lines in this region need to be resolved. FIGS. 14(a), 14(b) and 14(c) show the response of the spectrometer to the same gaussian input spectra used to generate FIG. 12. However, the R matrix was defined only over local regions around the input spectra. This results in a new b matrix and, as the parts of FIG. 14 show, considerable improvement in the measured spectra. With the wavelength band limited to 900–1100 nm the input spectrum centered at 1000 nm, which was essentially unmeasureable in FIG. 12(c) was resolved quite well as shown in FIG. 14(c), with out-of-band noise less than 10% of the peak. FIG. 15 shows the response of the spectrometer to the same doublet used to generate FIG. 13, with a local region defined from 740–910 nm. The measured peaks were essentially as well resolved as the input peaks with no appreciable increase in the full width at half maximum (FWHM).

Figure 16:
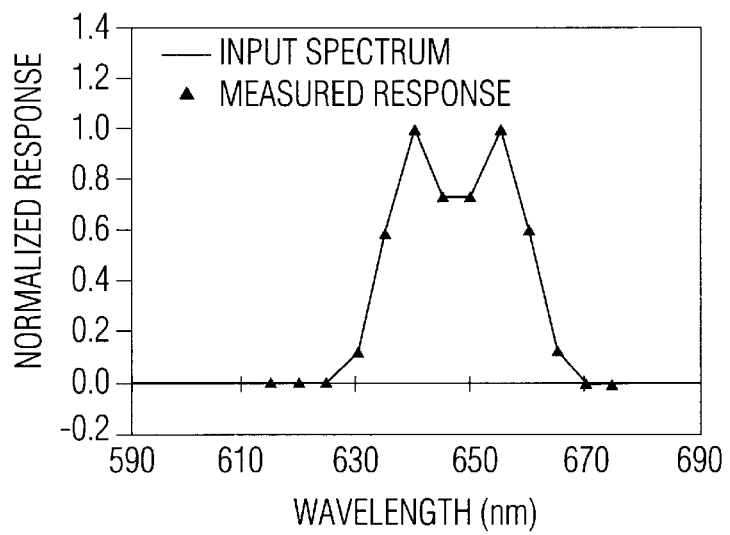
FIG. 16 is a plot useful for explaining the response of the spectrometer to a doublet centered at 640 nm and 655 nm with σ=5 nm, the solution space being constrained to the 620–680-nm band.
Figure 17:
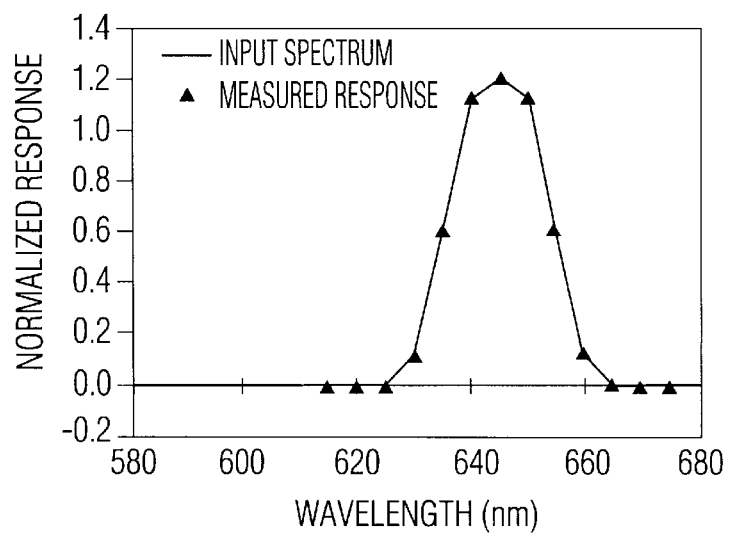
FIG. 17 is a plot useful for explaining the response of the spectrometer to a doublet centered at 640 nm and 650 nm with σ=5 nm, the solution space being constrained to the 620–680-nm band.

FIGS. 16 and 17 show the response of the spectrometer to a doublet ($\sigma$=5 nm) in the region 620–680 nm. As FIG. 16 shows, at a spacing of 15 nm the doublet is resolved. When the spacing is reduced to 10 nm, as illustrated by in FIG. 17, the doublet is unresolveable.

A photo-spectrometer which can be realized in a standard semiconductor process has been taught and described. Only the mask, materials, and fabrication steps inherent to a standard semiconductor process need be used to realize such a device. Such a spectrometer produces a composite response function constructed from the response functions of a plurality of individually characterized photodiodes. A specific embodiment utilizing 18 such photodiodes has been described in particular detail. The spectral responses of the photodiodes can be decoupled by using different junction depths and polycrystalline silicon and oxide coverings.

A spectrometer according to the inventive arrangements offers modest performance as a wide-band spectrometer, but offers excellent performance when a priori knowledge of the input spectra can be used to constrain the solution space to a narrow band, for example ~100–200 nm, within the broader spectral response of the particular semiconductor.

While the spectrometer taught herein does not provide the resolution of diffraction or reflective gratings or photodiode array instruments, it can be mass produced in a standard IC process, requires no post-processing of the wafer, and can be integrated with a variety of other analog, digital, and wireless circuits to produce a true instrument-on-a-chip that can be applied in a variety of low-cost, low-power, rugged micro-instruments. Suitable semiconductor processes can include, for example, n-well CMOS, p-well CMOS, silicon-on-insulator (SOI) CMOS, Si bipolar and most other semiconductor processes as well.

What is claimed is:

1. A spectrometer, comprising:
   a semiconductor having a silicon substrate, said silicon substrate having integrally formed thereon a plurality of layers and junctions forming photo diodes, each of said photo diodes having an output signal representative of an independent spectral response to an input spectra within a spectral range of said semiconductor and each of said photo diodes formed only from at least one of said plurality of layers of said semiconductor above said silicon substrate;

a signal processing circuit for modifying said output signals from said photo diodes with respective weights, said respectively weighted output signals together being representative of a specific spectral response to said input spectra; and, said semiconductor and said signal processing circuit being formed by only standard CMOS semiconductor materials, masks and fabrication steps.

2. The spectrometer of claim 1, wherein said photodiodes differ from one another with respect to junction depths and with respect to polycrystalline silicon and oxide coverings.

3. The spectrometer of claim 1, wherein said signal processing circuit sums said weighted signals to define a composite spectral response function.

4. The spectrometer of claim 1, wherein said respective weights are set in accordance with predetermined information regarding an expected limited range of wavelengths to be detected within said spectral range of said semiconductor.

5. The spectrometer of claim 4, wherein said limited range of wavelengths to be detected is approximately 100–200 nanometers.

6. A spectrometer, comprising:

a semiconductor having a silicon substrate and a light transmissive surface, said semiconductor having a plurality of pn junctions located above said substrate at different fixed depths from said surface, said pn junctions generating respective and independent output signals representative of unique depth-related spectral sensitivity functions;

a signal processing circuit for modifying said output signals from said pn junctions with respective weights, said weighted output signals together being representative of a specific spectral response to an input spectra radiating said pn junctions; and, said semiconductor and said signal processing circuit being formed by only standard CMOS semiconductor materials, masks and fabrication steps.

7. The spectrometer of claim 6, wherein said signal processing circuit sums said weighted signals to define a composite spectral response function.

8. The spectrometer of claim 6, wherein said unique depth-related spectral sensitivity functions of said pn junctions interact with said input spectra at different regions of said semiconductor above said substrate, whereby said output signals generated by said pn junctions differ from one another.

9. The spectrometer of claim 8, wherein said different regions include a p-diffusion region, a depletion region, and a region beyond the depletion region.

10. A method for manufacturing a spectrometer, comprising the steps of:

providing a plurality of sites on a silicon substrate which have different junction depths and different polycrystalline silicon and oxide coverings, each of said sites having an independent spectral response to an input spectra;

integrating said sites with a circuit for respectively weighting and summing said spectral responses from said sites, by using said standard semiconductor processing, said weighted signals representing a specific spectral response of said input spectra; and, implementing said providing and integrating steps using only standard CMOS semiconductor materials, masks and fabrication steps.

11. The method of claim 10, comprising the step of integrating said sites with a wireless signal processing circuit.

12. The method of claim 10, further comprising the step of summing said weighted signals co define a composite spectral response function.

13. The method of claim 10, comprising the step of integrating said sites with an analog signal processing circuit.

14. The method of claim 10, comprising the step of integrating said sites with a digital signal processing circuit.

* * * * *